(12) United States Patent
Jung et al.

(10) Patent No.: US 11,521,922 B2
(45) Date of Patent: Dec. 6, 2022

(54) PRINTED CIRCUIT BOARD

(71) Applicant: SAMSUNG ELECTRO-MECHANICS CO., LTD., Suwon-si (KR)

(72) Inventors: Joo Hwan Jung, Suwon-si (KR); Seung Eun Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 25 days.

(21) Appl. No.: 17/213,890

(22) Filed: Mar. 26, 2021

(65) Prior Publication Data

US 2021/0407897 A1 Dec. 30, 2021

(30) Foreign Application Priority Data

Jun. 30, 2020 (KR) ........................ 10-2020-0079717

(51) Int. Cl.
*H05K 7/00* (2006.01)
*H01L 23/498* (2006.01)
*H01L 23/538* (2006.01)
*H01L 25/18* (2006.01)

(52) U.S. Cl.
CPC .... *H01L 23/49833* (2013.01); *H01L 23/5383* (2013.01); *H01L 23/5385* (2013.01); *H01L 25/18* (2013.01)

(58) Field of Classification Search
CPC ........... H01L 23/49833; H01L 23/5383; H01L 23/5385; H01L 25/18

USPC ......................................................... 361/783
See application file for complete search history.

(56) References Cited

U.S. PATENT DOCUMENTS

| 10,475,835 B2 * | 11/2019 | Pan .................... H01L 27/14636 |
| 2013/0157498 A1 * | 6/2013 | Scholvin ................ H01R 13/03 205/261 |
| 2015/0036305 A1 * | 2/2015 | Nanjo .................... H05K 1/186 29/830 |

(Continued)

FOREIGN PATENT DOCUMENTS

| JP | 2007110095 A | * | 4/2007 | ......... H01L 23/5385 |
| JP | 2008-085373 A | | 4/2008 | |

(Continued)

*Primary Examiner* — Andargie M Aychillhum
(74) *Attorney, Agent, or Firm* — Morgan, Lewis & Bockius LLP

(57) ABSTRACT

A printed circuit board includes a first wiring structure including first insulating layers and first wiring layers; a second wiring structure disposed on the first wiring structure and including second insulating layers and second wiring layers; and a third wiring structure disposed on the second wiring structure and including a third insulating layer and a third wiring layer disposed on the third insulating layer. At least a portion of at least one of the second wiring layers has a fine pitch, relatively finer than those of the first wiring layers and the third wiring layer, wherein at least a portion of one of the first wiring layers is connected to at least a portion of the third wiring layer through a first wiring via, and wherein the first wiring via penetrates at least one of the first insulating layers, the second insulating layers, and the third insulating layer.

20 Claims, 7 Drawing Sheets

(56) References Cited

U.S. PATENT DOCUMENTS

| | | | | |
|---|---|---|---|---|
| 2015/0245473 A1* | 8/2015 | Shimizu | ................ | H05K 1/113 |
| | | | | 29/850 |
| 2015/0364405 A1* | 12/2015 | Kunimoto | ......... | H01L 23/49811 |
| | | | | 174/251 |
| 2016/0088727 A1* | 3/2016 | Furutani | .............. | H05K 3/4673 |
| | | | | 174/262 |
| 2017/0160593 A1* | 6/2017 | Cho | | |
| 2018/0203318 A1* | 7/2018 | Abe | .................... | G09G 3/3688 |

FOREIGN PATENT DOCUMENTS

| | | | | | |
|---|---|---|---|---|---|
| JP | 2014075548 A | * | 4/2014 | ....... | H01L 23/49822 |
| JP | 6375121 B2 | | 7/2018 | | |

* cited by examiner

PRINTED CIRCUIT BOARD

CROSS-REFERENCE TO RELATED APPLICATION(S)

This application claims benefit of priority to Korean Patent Application No. 10-2020-0079717 filed on Jun. 30, 2020 in the Korean Intellectual Property Office, the disclosure of which is incorporated herein by reference in its entirety.

TECHNICAL FIELD

The present disclosure relates to a printed circuit board, and more particularly, to a printed circuit board used for a package board for mounting an electronic component.

BACKGROUND

The interposer market has been growing due to a high specification of a set and employment of a high bandwidth memory (HBM). Mostly, silicon has been used as a material for an interposer. For example, in the case of a semiconductor package using an interposer, a die may be surface-mounted on a silicon interposer and molded with a molding material.

Due to the increase in the number of HBMs for the high specification of a set, an interposer has also been designed to have high performance, and accordingly, the difficulty of a process may increase, and the issue of a lowered yield has emerged as a high risk.

SUMMARY

An aspect of the present disclosure is to provide a printed circuit board which may easily implement a microcircuit pattern.

Another aspect of the present disclosure is to provide a printed circuit board which may secure sufficient adhesive force between a microcircuit pattern and an insulating material.

Another aspect of the present disclosure is to provide a printed circuit board which may replace a silicon interposer.

According to an aspect of the present disclosure, a printed circuit board including a microcircuit pattern may be provided by attaching a microcircuit board manufactured through a separate microcircuit process to one side of a multilayer wiring substrate.

For example, according to an aspect of the present disclosure, a printed circuit board may include a first wiring structure including a plurality of first insulating layers and a plurality of first wiring layers; a second wiring structure disposed on the first wiring structure and including a plurality of second insulating layers and a plurality of second wiring layers; and a third wiring structure disposed on the second wiring structure and including a third insulating layer and a third wiring layer disposed on the third insulating layer. At least a portion of at least one of the plurality of second wiring layers may have a fine pitch, relatively finer than those of the plurality of first wiring layers and the third wiring layer. At least a portion of one of the plurality of first wiring layers may be connected to at least a portion of the third wiring layer through a first wiring via. The first wiring via may penetrate at least one of the plurality of first insulating layers, the plurality of second insulating layers, and the third insulating layer.

For example, according to an aspect of the present disclosure, a printed circuit board may include a first wiring structure including a plurality of first insulating layers and a plurality of first wiring layers; a second wiring structure disposed above the first wiring structure and including one or more second insulating layers and one or more second wiring layers; and a third wiring structure disposed above the second wiring structure and including a third insulating layer and a third wiring layer disposed on the third insulating layer. An uppermost second wiring layer of the one or more second wiring layers may be buried in an uppermost second insulating layer of the one or more second insulating layers. An upper surface of the uppermost second wiring layer may be in contact with the third insulating layer. The number of conductive patterns included in the uppermost second wiring layer may be smaller than the number of conductive patterns included in the third wiring layer.

For example, according to an aspect of the present disclosure, a printed circuit board may include a core layer; a plurality of upper insulating layers disposed on an upper side of the core layer; a plurality of upper wiring layers disposed on or in the plurality of upper insulating layers, respectively; a plurality of lower insulating layers disposed on a lower side of the core layer opposing the upper side; and a plurality of lower wiring layers disposed on or in the plurality of lower insulating layers, respectively. A portion of one of the plurality of upper wiring layers may have a fine pitch, relatively finer than those of other upper wiring layers among the plurality of upper wiring layers and relatively finer than those of the plurality of lower wiring layers. The one of the plurality of upper wiring layers having the portion with the fine pitch, and another of the plurality of upper wiring layers may respectively protrude from opposing sides of one of the plurality of upper insulating layers

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
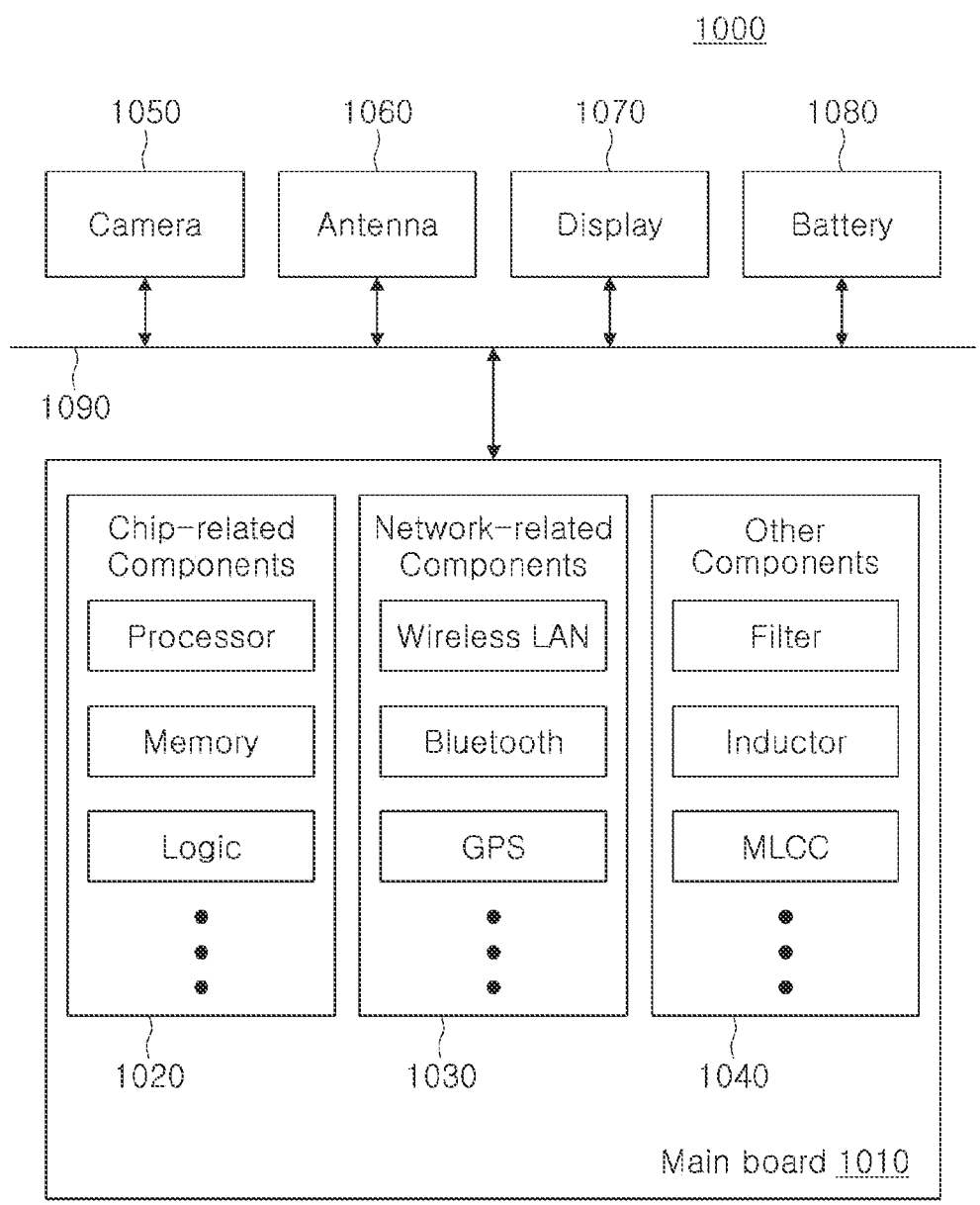
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
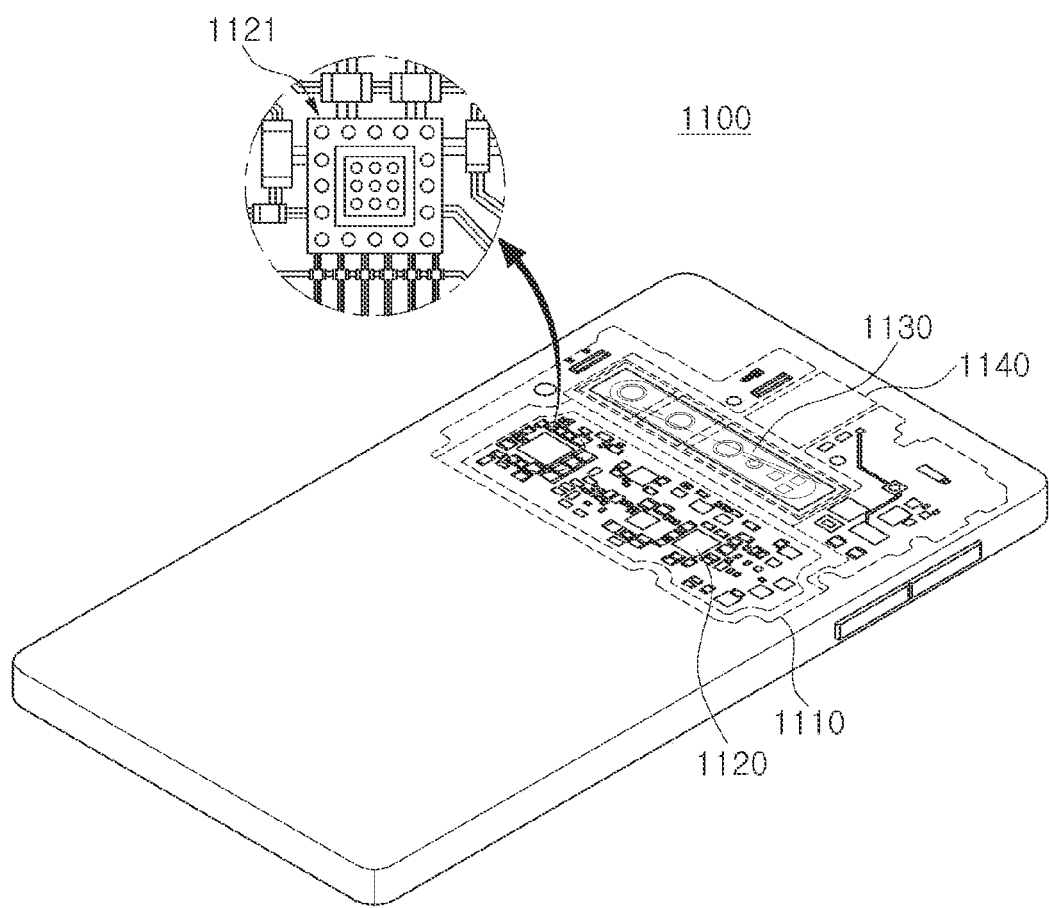
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, but may be other electronic devices as described above.

Figure 3:
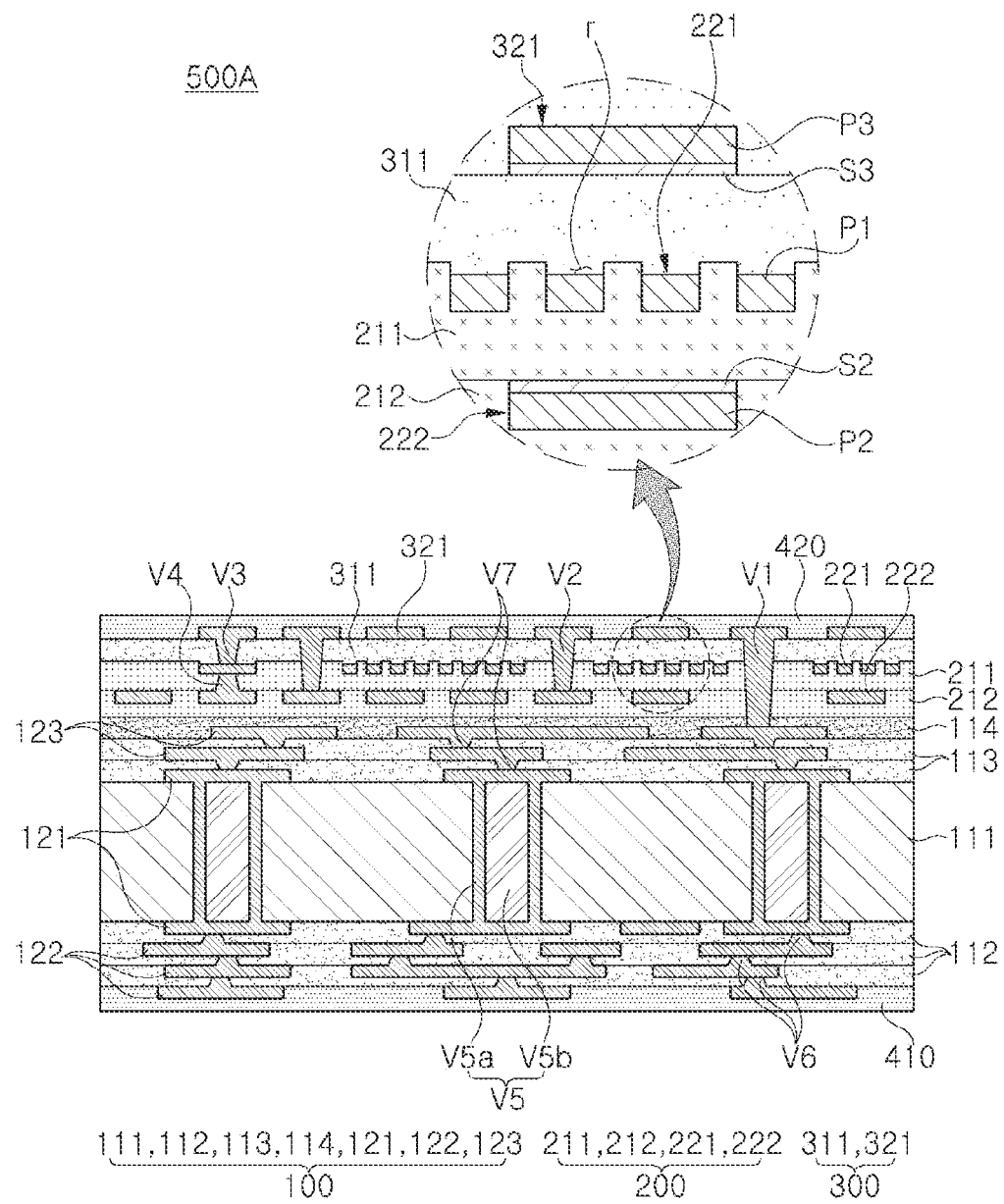
FIG. 3 is a cross-sectional diagram illustrating an example of a printed circuit board.

FIG. 3 is a cross-sectional diagram illustrating an example of a printed circuit board.

Referring to FIG. 3, a printed circuit board 500A in the example embodiment may include a first wiring structure 100 including a plurality of first insulating layers 111, 112, 113, and 114 and a plurality of first wiring layers 121, 122, and 123, a second wiring structure 200 including a plurality of second insulating layers 211 and 212 and a plurality of second wiring layers 221 and 222, and a third wiring structure 300 including a third insulating layer 311 and a third wiring layer 321. The first to third wiring structures 100, 200, and 300 may be stacked in order. If necessary, first and second passivation layers 410 and 420 may be respectively disposed above and below the stack body including the first to third wiring structures 100, 200, and 300.

As described above, as the number of HBMs has been increased than before due to high specification of a set recently, a silicon interposer has also been configured to have high performance, and accordingly, difficulty of process may increase and a yield may decrease, and a price may also increase. To address the issues above, as a method to replace a silicon interposer, it may be considered to form a microcircuit in a flip chip ball grid array (FCBGA) substrate and to use the substrate as a package substrate. However, the microcircuit technology in the FCBGA substrate should use a semi additive process (SAP) method. In this case, an undercut may occur when a seed layer below a pattern is etched, and an undercut may reduce adhesive force between the pattern and an insulating material. Therefore, there may be a limitation in forming a microcircuit pattern having a desired level of fine pitch.

The printed circuit board 500A in the example embodiment may be a microcircuit board including a microcircuit pattern in which the second wiring structure 200 may be separately manufactured using an embedded trace substrate (ETS) method as in the process described below, and may be attached to the first wiring structure 100 upside down. For example, an uppermost second wiring layer 221 of the plurality of second wiring layers 221 and 222 may include a microcircuit pattern having a fine pitch relatively finer than those of the plurality of first wiring layers 121, 122, and 123 and the third wiring layer 321. The configuration in which a relatively fine pitch is included may indicate that a spacing between wiring patterns included in the corresponding wiring layer may be relatively finer than a spacing between wiring patterns included in the wiring layer to be compared, such that wiring density may be relatively higher. Therefore, the board may replace a silicon interposer. Also, as the above-described undercut issue may not occur when the microcircuit pattern is formed, a microcircuit pattern having a desired level of fine pitch may be formed without the issue of reduced adhesive force.

Accordingly, the uppermost second wiring layer 221 of the plurality of second wiring layers 221 and 222 may be buried in the uppermost second insulating layer 211 of the plurality of second insulation layers 211 and 212 such that an upper surface thereof may be in contact with the third insulating layer 311. Also, the number of conductive layers P1 included in the uppermost second wiring layer 221 may be smaller than the number of conductive layers S2 and P2 included in the other second wiring layer 222 of the plurality of second wiring layers 221 and 222 and the number of conductive layers S3 and P3 included in the third wiring layer 321. For example, the uppermost second wiring layer 221 may include a single conductive layer P1 without a seed layer. Also, an upper surface of the uppermost second wiring layer 221 may have a difference from an upper surface of the uppermost second insulating layer 211. Due to the difference, a recessed region r may be provided on an upper side of the uppermost second insulating layer 211, and at least a portion of the recessed region r may be filled with the third insulating layer 311.

Also, accordingly, at least a portion of the uppermost first wiring layer 123 of the plurality of first wiring layers 121, 122, and 123 and at least a portion of the third wiring layer 321 may be connected to at least a portion of the uppermost first insulating layers 111 of the plurality of first insulating layers 111, 112, 113, and 114 through a first wiring via V1 collectively penetrating the plurality of second insulating layers 211 and 212 and the third insulating layer 311. Also, at least a portion of the lowermost second wiring layer 222 of the plurality of second wiring layers 221 and 222 and at least a portion of the third wiring layer 321 may be connected to each other through a second wiring via V2 collectively penetrating the uppermost second insulating layer 211 of the plurality of second insulating layers 211 and 212 and the third insulating layer 311. Accordingly, upward and downward electrical connection paths may be provided through the wiring vias V1 and V2 penetrating the plurality of insulating layers.

Also, accordingly, at least a portion of the uppermost second wiring layer 221 of the plurality of second wiring layers 221 and 222 and at least a portion of the third wiring layer 321 may be connected to each other through a third wiring via V3 penetrating the third insulating layer 311. Also, at least portions of the plurality of second wiring layers 221 and 222 may be connected to each other through a fourth wiring via V4 penetrating the uppermost second insulating layer 211 of the plurality of second insulating layers 211 and 212. In this case, the third and fourth wiring vias V3 and V4 may have side surfaces tapered in opposite directions. Accordingly, the second wiring structure 200 may be disposed upside down such that the second wiring layer 221, which is a buried pattern having a fine pitch, may be disposed on the uppermost side on the first wiring structure 100, and accordingly, the fourth wiring via V4 formed in the second wiring structure 200 may have a tapered shape tapered in the direction opposite to the direction in which the third wiring via V3 formed after the second wiring structure 200 are disposed is tapered, that is, the direction in which the first to third wiring vias V1, V2, and V3, for example, are tapered.

In the description below, each of the elements included in the printed circuit board 500A according to an example will be described in greater detail with reference to the drawings.

The first wiring structure 100 may include a plurality of first insulating layers 111, 112, 113 and 114 and a plurality of first wiring layers 121, 122, and 123. The first wiring structure 100 may have a cored-type substrate structure. Therefore, the first wiring structure 100 may have a thickness greater than those of the second and third wiring structures 200 and 300. For example, the first wiring structure 100 may include a core layer 111 including the plurality of first insulating layers 111, 112, 113, and 114 each having a relatively great thickness, a plurality of first built-up layers 112 disposed below the core layer 111, and a plurality of second built-up layers 113 and 114 disposed above the core layer 111. The number of layers of the plurality of first built-up layers 112 and the number of the plurality of second built-up layers 113 and 114 may be the same, and thus, the first wiring structure 100 may have a symmetrical structure. Also, the first wiring structure 100 may include a core wiring layer 121 in which the plurality of first wiring layers 121, 122, and 123 are disposed on both surfaces of the core layer 111, a plurality of first built-up wiring layers 122 disposed on and/or in the plurality of first built-up layers 112, and a plurality of second built-up wiring layers 123 disposed on and/or in the plurality of second built-up layers 113 and 114. The number of layers of the plurality of first and second built-up layers 112, 113, and 114 and the number of layers of the plurality of first and second built-up wiring layers 122 and 123 are not limited to any particular examples, and may be greater or smaller than the examples illustrated in the diagram.

An insulating material may be used as a material of the core layer 111 and the plurality of first and second built-up insulating layers 112, 113, and 114, and as the insulating material, a thermosetting resin such as epoxy resin or a thermoplastic resin such as polyimide, or a resin including inorganic fillers such as silica and/or reinforcing materials such as glass fibers may be used. For example, as a material for the core layer 111, an insulating material of a copper clad laminate (CCL) may be used. Also, a prepreg may be used as a material of the plurality of first and second built-up insulating layers 112, 113, and 114. The uppermost second built-up insulating layer 114 of the plurality of second built-up insulating layers 113 and 114, that is, the uppermost first insulating layer 114 of the plurality of first insulating layers 111, 112, 113, and 114 may be in contact with the lowermost second insulating layer 212 of the plurality of second insulating layers 211 and 212. To secure adhesive force, an Ajinomoto built-up film (ABF) may be used as a material for the uppermost second built-up insulating layer 114 of the plurality of second built-up insulating layers 113 and 114. Also, a wiring layer may not be disposed on a boundary between the uppermost second built-up insulating layer 114, that is, the uppermost first insulating layer 114, and the lowermost second insulating layer 212.

A metal material may be used as a material for the core wiring layer 121 and the plurality of first and second built-up wiring layers 122 and 123, and as the metal material, copper (Cu), aluminum (Al), and silver (Ag), tin (Sn), gold (Au), nickel (Ni), lead (Pb), titanium (Ti), or an alloy thereof may be used. Each of the core wiring layer 121 and the plurality of first and second built-up wiring layers 122 and 123 may perform various functions according to a design. For example, the core wiring layer 121 and the plurality of first and second built-up wiring layers 122 and 123 may include a ground pattern, a power pattern, a signal pattern, and the like. Here, the signal pattern may include various signals other than the ground pattern and the power pattern, such as a data signal, for example. Each of these patterns may have a shape of line, a shape of plane, or a pad shape. The core wiring layer 121 and the plurality of first and second built-up wiring layers 122 and 123 may be formed by a plating process such as an additive process (AP), a semi-AP (SAP) process, a modified SAP (MSAP) process, a tenting (TT) process, or the like, and may thus include a seed layer, which is an electroless plating layer, and an electrolytic plating layer formed on the basis of the seed layer. The specific layer may further include copper foil.

The second wiring structure 200 may include a plurality of second insulating layers 211 and 212 and a plurality of second wiring layers 221 and 222. The second wiring structure 200 may have a coreless-type substrate structure. Therefore, the second wiring structure 200 may have a thickness less than that of the first wiring structure 100 and greater than that of the third wiring structure 300. For example, the second wiring structure 200 may be a built-up layer in which the plurality of second insulating layers 211 and 212 may have substantially the same thickness. Also, the second wiring structure 200 may be a buried pattern having a fine pitch in which the uppermost second wiring layer 221 of the plurality of second wiring layers 221 and 222 may be buried in the uppermost second insulating layer 211 of the plurality of second insulating layers 211 and 212 and may be in contact with the third insulating layer 311. The number of layers of the plurality of second insulating layers 211 and 212 and the number of layers of the plurality of second wiring layers 221 and 222 may not be limited to any particular number, and may be larger than the examples in the diagram, and each may have only a single layer.

An insulating material may be used as a material of the plurality of second insulating layers 211 and 212, and as the insulating material as the insulating material, a thermosetting resin such as epoxy resin or a thermoplastic resin such as polyimide, or a resin including inorganic fillers such as silica and/or reinforcing materials such as glass fibers may be used. For example, a prepreg, ABF, or the like, may be used as a material for the plurality of second insulating layers 211 and 212. As described above, the printed circuit board 500A in the example embodiment may have an advantage that a microcircuit pattern may be formed without using a new material such as a photo image-able dielectric (PID), a photo-sensitive material.

A metal material may be used as a material of the plurality of second wiring layers 221 and 222, and as a metal material, copper (Cu), aluminum (Al), silver (Ag), tin (Sn), gold (Au), nickel (Ni), lead (Pb), titanium (Ti), or an alloy thereof may be used. Each of the plurality of second wiring layers 221 and 222 may perform various functions according to a design. For example, the plurality of second wiring layers 221 and 222 may include a ground pattern, a power pattern, a signal pattern, and the like. Each of these patterns may have a shape of line, a shape of plane, or a pad shape. The uppermost second wiring layer 221 may be formed by a plating process according to an ETS method as described above, and may thus include only a single conductive layer P1 without a seed layer as described above. The other second wiring layer 222 may be formed by a plating process such as AP, SAP, MSAP, or TT, and may thus include a seed layer S2, which is an electroless plating layer, and a metal layer P2, an electrolytic plating layer formed on the basis of the seed layer S2. In other words, the other second wiring layer 222 may include a plurality of conductive layers S2 and P2 including the seed layer S2. If necessary, the other second wiring layer 222 may further include a primer copper foil.

The third wiring structure 300 may include a third insulating layer 311 and a third wiring layer 321. The third wiring structure 300 may be formed to provide an outermost layer for mounting an electronic component on an upper side of the printed circuit board 500A after attaching the second wiring structure 200 to the first wiring structure 100. In the third wiring structure 300, each of the third insulating layer 311 and the third wiring layer 321 may include a plurality of layers, if necessary.

As a material of the third insulating layer 311, a thermosetting resin such as an epoxy resin or a thermoplastic resin such as polyimide, or a resin including inorganic fillers such as silica and/or reinforcing materials such as glass fibers may be used. For example, a prepreg, ABF, or the like, may be used as a material of the third insulating layer 311.

As a material of the third wiring layer 321, a metal material such as copper (Cu), aluminum (Al), silver (Ag), tin (Sn), gold (Au), nickel (Ni), lead (Pb), titanium (Ti) or an alloy thereof may be used. The third wiring layer 321 may also perform various functions according to a design. For example, the third wiring layer 321 may include a ground pattern, a power pattern, a signal pattern, and the like. Each of these patterns may have a shape of line, a shape of plane, or a pad shape. The third wiring layer 321 may be formed by a plating process such as AP, SAP, MSAP, or TT, and may thus include a seed layer S3, which is an electroless plating layer, and a metal layer P3, which is an electrolytic plating layer formed on the basis of the seed layer S3. In other words, the third wiring layer 321 may include a plurality of conductive layers S3 and P3 including the seed layer S3. If necessary, the remaining third wiring layer 321 may further include a primer copper foil.

The first wiring via V1 may connect at least a portion of the uppermost first wiring layer 123 to at least a portion of the third wiring layer 321. The first wiring via V1 may collectively penetrates the uppermost first insulating layer 114, the plurality of second insulating layers 211 and 212, and the third insulating layer 311. As a materials of the first wiring via V1, a metal material such as copper (Cu), aluminum (Al), silver (Ag), tin (Sn), gold (Au), nickel (Ni), lead (Pb), titanium (Ti), or an alloy thereof may be used. The number of first wiring vias V1 may be two or more, and may include a signal connection via, a ground connection via, a power connection via, and the like, according to a design. The first wiring via V1 may be completely filled with a metal material, or may be formed along a wall surface of the via hole. The first wiring via V1 may have a tapered shape in which a width of an upper surface is wider than a width of a lower surface. The first wiring via V1 may be formed by a plating process such as AP, SAP, MSAP, or TT, for example, and may thus include a seed layer, which is an electroless plating layer, and an electrolytic plating layer formed on the basis of the seed layer. If necessary, a primer copper foil may be further included.

The second wiring via V2 may connect at least a portion of the lowermost second wiring layer 222 to the third wiring layer 321. The second wiring via V2 may collectively penetrate the second insulating layer 211 and the third insulating layer 311 disposed on the uppermost side. As a materials for the second wiring via (V2), a metal material such as copper (Cu), aluminum (Al), silver (Ag), tin (Sn), gold (Au), nickel (Ni), lead (Pb), titanium (Ti) or an alloy thereof may be used. The number of second wiring vias V2 may be two or more, and may include a signal connection via, a ground connection via, a power connection via, and the like, according to a design. The second wiring via V2 may be completely filled with a metal material, or may be formed along a wall surface of the via hole. The second wiring via V2 may have a tapered shape having an upper surface wider than a lower surface. The second wiring via V2 may be formed by a plating process such as AP, SAP, MSAP, or TT, for example, and may thus include a seed layer, which is an electroless plating layer, and an electrolytic plating layer formed on the basis of the seed layer. If necessary, the second wiring via V2 may further include a primer copper foil.

The third wiring via V3 may connect at least a portion of the uppermost second wiring layer 221 to the third wiring layer 321. The third wiring via V3 may penetrate the third insulating layer 311. As a material for the third wiring via V3, a metal material such as copper (Cu), aluminum (Al), silver (Ag), tin (Sn), gold (Au), nickel (Ni), lead (Pb), titanium (Ti), or an alloy thereof may be used. The number of third wiring vias V3 may be two or more, and may include a signal connection via, a ground connection via, a power connection via, and the like according to a design. The third wiring via V3 may be completely filled with a metal material, or may be formed along a wall surface of the via hole. The third wiring via V3 may have a tapered shape in which a width of an upper surface is wider than that of a lower surface. The third wiring via V3 may be formed by a plating process such as AP, SAP, MSAP, TT, for example, and may thus include a seed layer, which is an electroless plating layer, and an electroplating layer formed on the basis of the seed layer. If necessary, a primer copper foil may be further included The fourth wiring via V4 may connect at least portions of the plurality of second wiring layers 221 disposed on different layers to each other. The fourth wiring via V4 may penetrate the uppermost second insulating layer 211. As a materials for the fourth wiring via V4, a metal material such as copper (Cu), aluminum (Al), silver (Ag), tin (Sn), gold (Au), nickel (Ni), lead (Pb), titanium (Ti), or an alloy thereof may be used. The number of fourth wiring vias V4 may be two or more, and may include a signal connection via, a ground connection via, a power connection via, and the like, according to a design. The fourth wiring via V4 may be completely filled with a metal material, or may be formed along a wall surface of the via hole. The fourth wiring via V4 may have a tapered shape in which a width of a lower surface is wider than a width of an upper surface. The fourth wiring via V4 may be formed by a plating process such as AP, SAP, MSAP, TT, for example, and may thus include a seed layer, which is an electroless plating layer, and an electrolytic plating layer formed on the basis of the seed layer. If necessary, a primer copper foil may be further included.

The fifth wiring via V5 may penetrate the core layer 111 and may connect at least portions of the plurality of core wiring layers 121 disposed on different layers to each other. The fifth wiring via V5 may have a relatively large height, and may have a plated through hole (PTH) shape. Accordingly, the fifth wiring via V5 may include a plating layer V5a plated on a wall surface of the through hole and a filler V5b filling a space between the plating layers V5a. The plating layer V5a may include a metal material such as copper (Cu), aluminum (Al), silver (Ag), tin (Sn), gold (Au), nickel (Ni), lead (Pb), titanium (Ti), or an alloy thereof, and the filler V5b may include plugging ink. A plurality of fifth wiring vias V5 may be provided, and may include a signal connection via, a ground connection via, a power connection via, or the like according to a design. The plating layer V5a may be formed by a plating process such as AP, SAP, MSAP, TT, or the like, and may thus include a seed layer, which is an electroless plating layer, and an electrolytic plating layer formed on the basis of the seed layer. If necessary, a primer copper foil may be further included.

The sixth wiring via V6 may penetrate each of the plurality of first built-up insulating layers 112 and may connect at least portions of the plurality of first built-up wiring layers 122 disposed on different layers to each other. The sixth wiring via V6 may also connect at least a portion of the core wiring layer 121 disposed on a lower side to at least a portion of the uppermost first built-up wiring layer 122. The sixth wiring via V6 may be provided as a plurality of layers. Also, the plurality of sixth wiring vias V6 may be provided in each layer. As a materials for the sixth wiring via V6, a metal material such as copper (Cu), aluminum (Al), silver (Ag), tin (Sn), gold (Au), nickel (Ni), lead (Pb), titanium (Ti), or an alloy thereof, may be used. The sixth wiring via V6 may include a signal connection via, a ground connection via, and a power connection via according to a design. The sixth wiring via V6 may be completely filled with a metal material, or may be formed along a wall surface of the via hole. The sixth wiring via V6 may have a tapered shape in which a width of a lower surface is wider than a width of an upper surface. The sixth wiring via V6 may be formed by a plating process AP, SAP, MSAP, or TT, for example, and may thus include a seed layer, which is an electroless plating layer, and an electrolytic plating layer formed on the basis of the seed layer. If necessary, a primer copper foil may be further included.

The seventh wiring via V7 may penetrate a portion of the plurality of second built-up insulating layers 113 and 114, and may connect at least portions of a plurality of second built-up wiring layers 123 disposed on different layers to each other. Also, the seventh wiring via V7 may connect at least a portion of the core wiring layer 121 disposed on the upper side to at least a portion of each of the lowermost second built-up wiring layer 123. The seventh wiring via V7 may be provided as a plurality of layers. Also, a plurality of seventh wiring vias V7 may be provided in each layer. As a material of the seventh wiring via V7, a metal material such as copper (Cu), aluminum (Al), silver (Ag), tin (Sn), gold (Au), nickel (Ni), lead (Pb), titanium (Ti), or an alloy thereof may be used. The seventh wiring via V7 may include a signal connection via, a ground connection via, and a power connection via according to a design. The seventh wiring via V7 may be completely filled with a metal material, or may be formed along a wall surface of the via hole. The seventh wiring via V7 may have a tapered shape in which a width of an upper surface is wider than a width of a lower surface. The seventh wiring via V7 may be formed by a plating process AP, SAP, MSAP, or TT, for example, and may thus include a seed layer, which is an electroless plating layer, and an electroplating layer formed on the basis of the seed layer. If necessary, a primer copper foil may be further included.

The first passivation layer 410 may be disposed below the first wiring structure 100 and may cover at least a portion of the lowermost first wiring layer 122. The second passivation layer 420 may be disposed above the third wiring structure 300 and may cover at least a portion of the third wiring layer 321. Accordingly, the elements may be protected from external physical and chemical damage. An insulating material may be used as for a material of the first and second passivation layers 410 and 420, and as the insulating material, a thermosetting resin such as epoxy resin or a thermoplastic resin such as polyimide, or a resin formed by mixing the resins with an inorganic filler, such as an ABF, may be used, but an example embodiment thereof is not limited thereto. A solder resist (SR) including a photosensitive material may be used. If necessary, the first and second passivation layers 410 and 420 may have openings for exposing at least a portion of each of the lowermost first wiring layer 122 and the third wiring layer 321.

Figure 4:
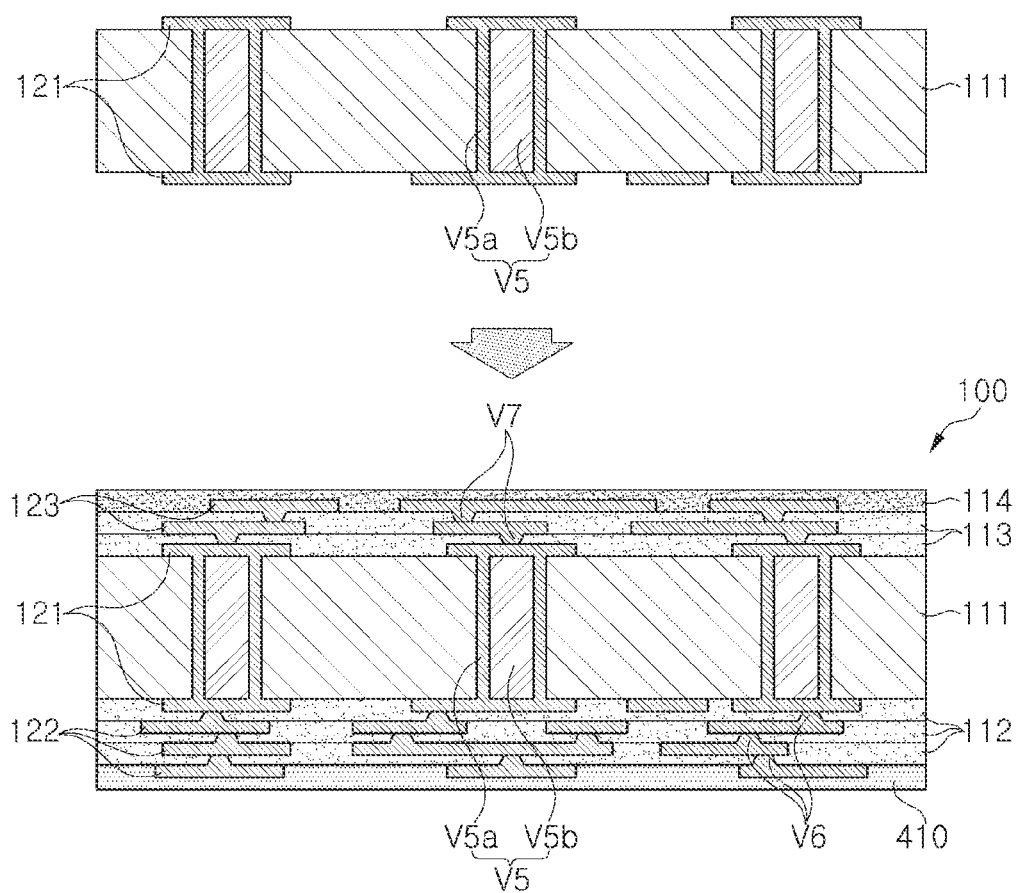
FIGS. 4 to 6 are cross-sectional diagrams illustrating processes for manufacturing the printed circuit board illustrated in FIG. 3.
Figure 5:
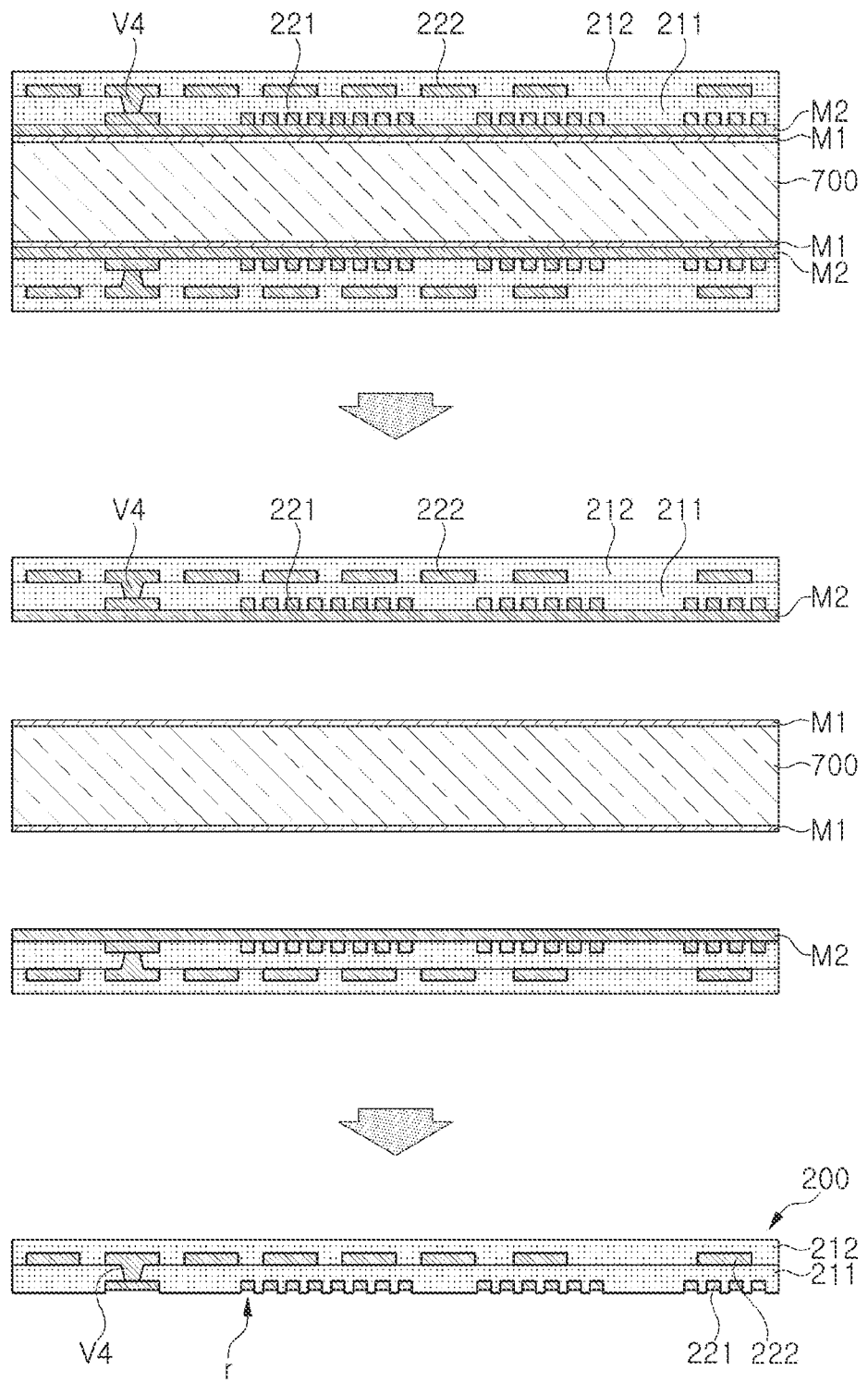
Figure 6:
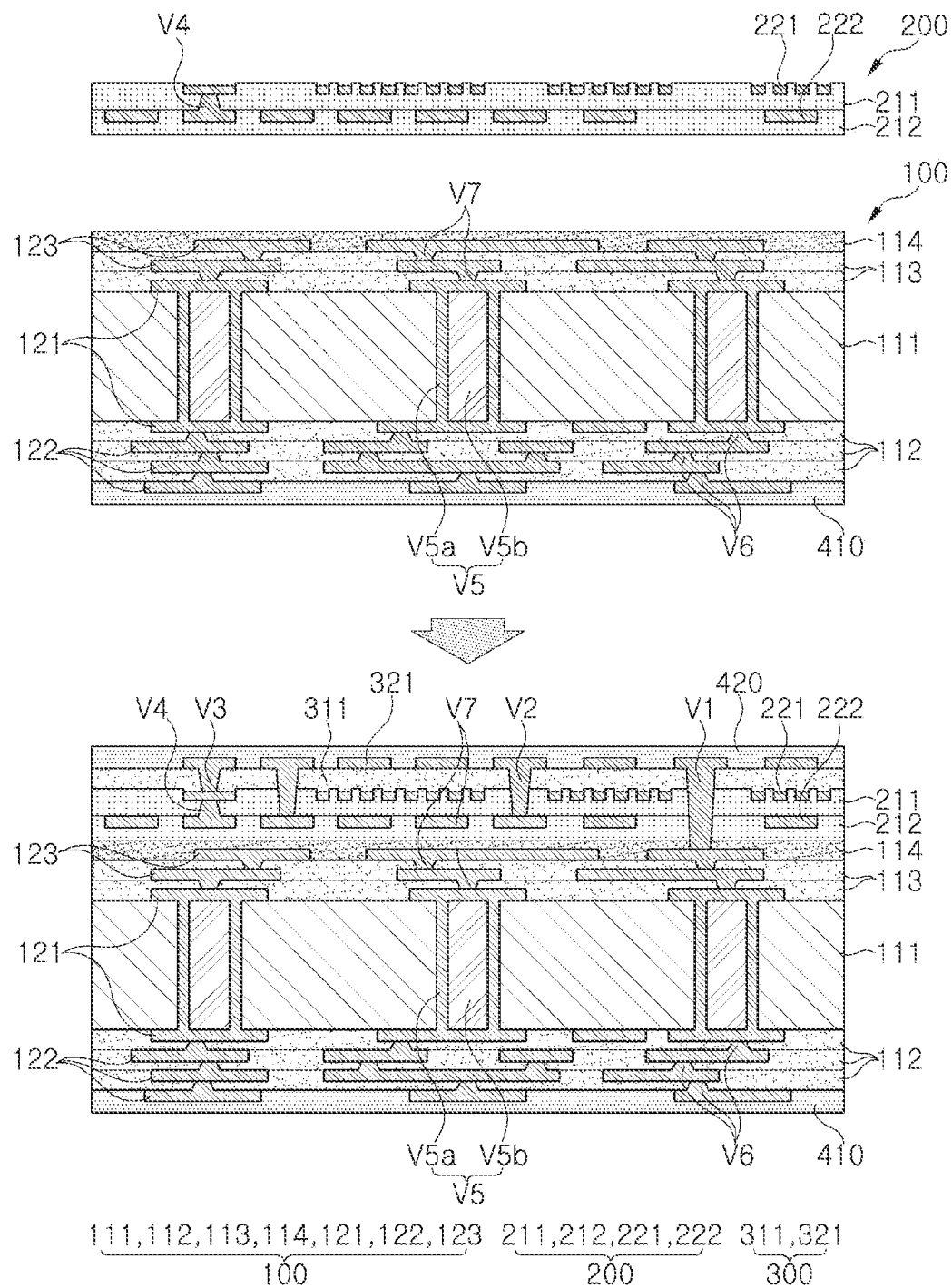

FIGS. 4 to 6 are cross-sectional diagrams illustrating processes for manufacturing the printed circuit board illustrated in FIG. 3.

Referring to FIG. 4, a copper clad laminate (CCL), or the like, useable as the core layer 111 may be prepared. Also, a through hole may be processed in the core layer 111 using a mechanical drill or the like, the through hole may be filled through plugging process, thereby forming a fifth wiring via V5. Also, core wiring layers 121 may be formed on both surfaces of the core layer 111 by a plating process. Thereafter, a plurality of first and second built-up insulating layers 112, 113 and 114 may be stacked on both sides of the core layer 111. In the process of stacking each layer, via holes may be formed by laser processing, etc., and may be filled with a plating process to form sixth and seventh wiring vias V6 and V7, and a plurality of first and second built-up wiring layers 122 and 123 may be formed by a plating process. Through this process, the first wiring structure 100 in which the fifth to seventh wiring vias V5, V6, and V7 are formed may be prepared.

Referring to FIG. 5, a carrier 700 in which a plurality of metal foils M1 and M2 may be formed on both sides thereof may be prepared. Thereafter, the second wiring layer 221 on a lower side, which is a buried pattern, may be formed by a plating process using the outermost metal foil M2 as a seed layer, and may be covered with the second insulating layer 211 disposed on the lower side. Thereafter, a via hole may be formed by laser processing, etc., and may be filled by a plating process to form a fourth wiring via V4, and a second wiring layer 222 on the upper side may be formed by a plating process, and may be covered by a second insulating layer 212. Accordingly, as it may not be necessary to separately form a seed layer for the second wiring layer 221 on the lower side, which is a buried pattern, the issues caused by undercuts, and the like, may be prevented. Thereafter, using a method of separating the plurality of metal foils M1 and M2, the stack body manufactured from the carrier 700 may be separated. As a release layer may be disposed between the plurality of metal foils M1 and M2, the separation may be facilitated. Thereafter, the metal foil M1 remaining in the stack body may be removed by etching, or the like. Accordingly, the second wiring layer 221 on the lower side, the buried pattern, may not have a seed layer even in the final structure. In this process, the above-described recessed region r may be formed. Through this process, the second wiring structure 200 in which the fourth wiring via V4 is formed may be prepared.

Referring to FIG. 6, a second wiring structure 200 may be attached to the first wiring structure 100. Specifically, the second wiring structure 200 may be inverted and may be stacked on the upper side of the first wiring structure 100 such that the lower second wiring layer 221 disposed on the lower side, which is the buried pattern, may be disposed on the upper side. Thereafter, the third insulating layer 311 may be built up on the second wiring structure 200, a via hole may be formed by laser processing, or the like, and may be filled using a plating process to form the first to third wiring vias V1, V2, and V3, and a third wiring layer 321 may be formed by a plating process. Through this process, the first wiring structure 100 in which the first to third wiring vias V1, V2, and V3 may be formed may be additionally formed.

A printed circuit board 500A of the example embodiment described above may be manufactured through a series of the processes, and as the other descriptions may be the same as above, the detailed descriptions thereof will not be repeated.

Figure 7:
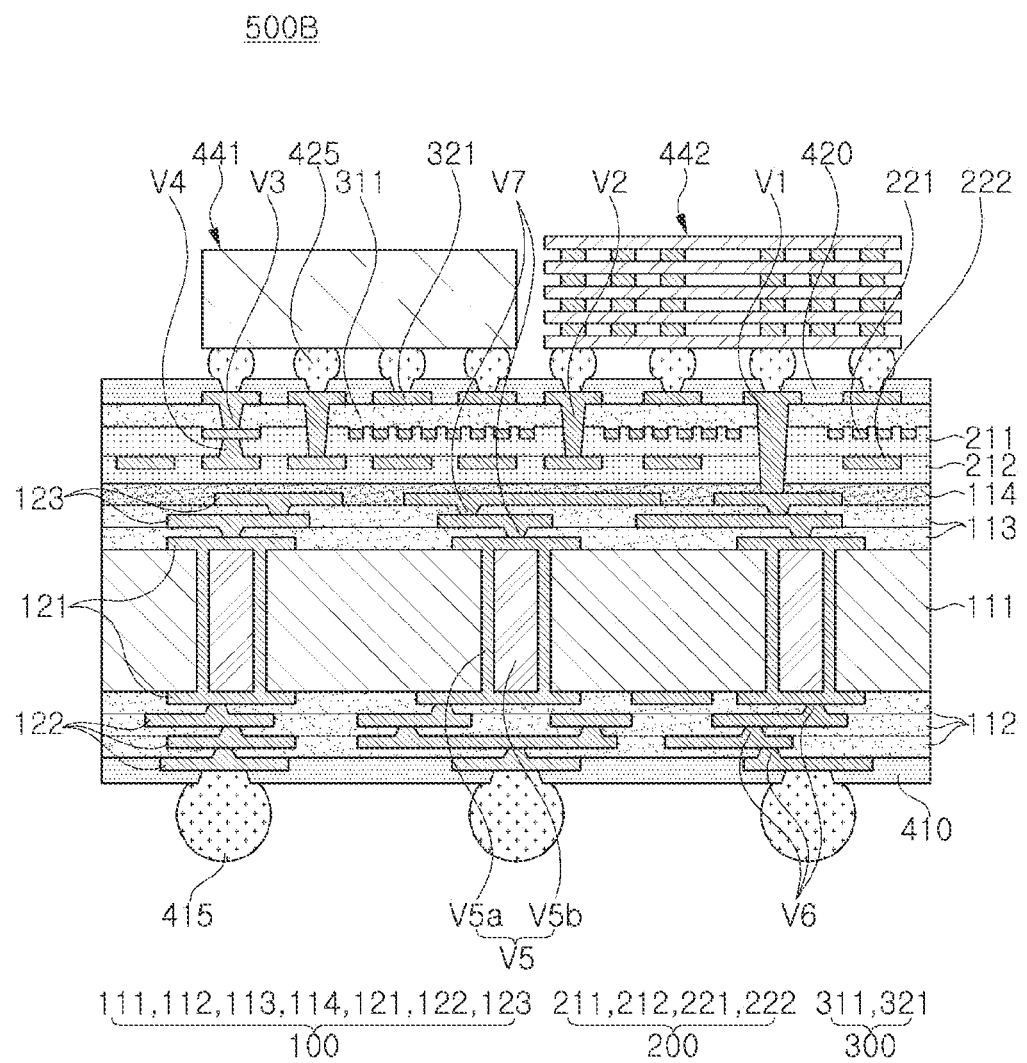
FIG. 7 is a cross-sectional diagram illustrating another example of a printed circuit board.

FIG. 7 is a cross-sectional diagram illustrating another example of a printed circuit board.

Referring to FIG. 7, a printed circuit board 500B in the example embodiment may further include first and second electrical connection metals 415 and 425 disposed on openings of first and second passivation layers 410 and 420, respectively. Further, the printed circuit board 500B in the example embodiment may further include a plurality of electronic components 441 and 442 surface-mounted on the second passivation layer 420 through the second electrical connection metal 425. The plurality of electronic components 441 and 442 may be connected to at least a portion of the third wiring layer 321 through a second electrical connection metal 425, and may be electrically connected to each other through a plurality of second wiring layers 221 and 222 having microcircuits.

The first and second electrical connection metals 415 and 425 may be formed of a low melting point metal having a lower melting point than that of copper (Cu), for example, and may be formed of tin (Sn) or an alloy including tin (Sn). For example, each of the first and second electrical connection metals 415 and 425 may be formed of solder, but example embodiments thereof are not limited thereto. Each of the first and second electrical connection metals 415 and 425 may be a land, a ball, a pin, or the like, and may be formed as a multilayer or a single layer. When formed as a multilayer, a copper pillar and a solder may be included, and when formed as a single layer, a tin-silver solder may be included, but an example embodiment thereof is not limited thereto.

The plurality of electronic components 441 and 442 may include an active device and/or a passive device. The active device may be a semiconductor chip in the form of an integrated circuit (IC) in which hundreds to millions of devices are integrated in a single chip. The semiconductor chip may be implemented by a logic chip or a memory chip. The logic chip may be implemented by a CPU, a GPU, or the like, an AP including at least one of a CPU and a GPU, an analog-to-digital converter, an ASIC, or the like, or a chip set including a combination thereof. The memory chip may be configured as a stack memory such as an HBM. The passive device may be configured as a chip-type passive component, and may be implemented by, for example, a high frequency inductor, a ferrite inductor, a power inductor, a ferrite bead, an LTCC, an EMI filter, an MLCC, or the like.

The descriptions of the other elements are the same as described above, and the detailed descriptions thereof will not be provided.

According to the aforementioned example embodiments, a printed circuit board which may easily implement a microcircuit pattern may be provided.

Also, a printed circuit board which may secure sufficient adhesive force between the microcircuit pattern and the insulating material may be provided.

Further, a printed circuit board which may replace a silicon interposer may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been shown and described above, it will be apparent to those skilled in the art that modifications and variations could be made without departing from the scope of the present invention as defined by the appended claims.

What is claimed is:

1. A printed circuit board, comprising:
   a first wiring structure including a plurality of first insulating layers and a plurality of first wiring layers;
   a second wiring structure disposed on the first wiring structure and including a plurality of second insulating layers and a plurality of second wiring layers; and
   a third wiring structure disposed on the second wiring structure and including a third insulating layer and a third wiring layer disposed on the third insulating layer,
   wherein at least a portion of at least one of the plurality of second wiring layers has a fine pitch, relatively finer than those of the plurality of first wiring layers and the third wiring layer,
   wherein at least a portion of one of the plurality of first wiring layers is connected to at least a portion of the third wiring layer through a first wiring via, and
   wherein the first wiring via penetrates at least three insulating layers, each of the at least three insulating layers being one of the plurality of first insulating layers, the plurality of second insulating layers, or the third insulating layer.

2. The printed circuit board of claim 1,
   wherein at least a portion of one of the plurality of second wiring layers is connected to at least a portion of the third wiring layer through a second wiring via, and
   wherein the second wiring via penetrates at least one of the plurality of second insulating layers and the third insulating layer.

3. The printed circuit board of claim 1,
   wherein at least a portion of another of the plurality of second wiring layers is connected to at least a portion of the third wiring layer through a third wiring via, and
   wherein the third wiring via penetrates the third insulating layer.

4. The printed circuit board of claim 3,
   wherein one of the plurality of second wiring layers is connected to at least a portion of the another of the plurality of second wiring layers through a fourth wiring via,
   wherein the fourth wiring via penetrates at least one of the plurality of second insulating layers, and
   wherein the third and fourth wiring vias have side surfaces tapered in opposite directions.

5. The printed circuit board of claim 1,
   wherein the first wiring structure has a thickness greater than a thickness of the second wiring structure, and
   wherein the second wiring structure has a thickness greater than a thickness of the third wiring structure.

6. The printed circuit board of claim 5,
   wherein the first wiring structure has a core-type substrate structure, and
   wherein the second wiring structure has a coreless-type substrate structure.

7. A printed circuit board, comprising:
   a first wiring structure including a plurality of first insulating layers and a plurality of first wiring layers;
   a second wiring structure disposed above the first wiring structure and including one or more second insulating layers and one or more second wiring layers; and
   a third wiring structure disposed above the second wiring structure and including a third insulating layer and a third wiring layer disposed on the third insulating layer,
   wherein an uppermost second wiring layer of the one or more second wiring layers is buried in an uppermost second insulating layer of the one or more second insulating layers,
   wherein an upper surface of the uppermost second wiring layer is in contact with the third insulating layer and
   wherein the number of conductive patterns included in the uppermost second wiring layer is smaller than the number of conductive patterns included in the third wiring layer.

8. The printed circuit board of claim 7,
   wherein the second wiring structure includes a plurality of second insulating layers and a plurality of second wiring layers, and
   wherein the number of conductive patterns included in the uppermost second wiring layer is smaller than the number of conductive patterns included in another of the plurality of second wiring layers.

9. The printed circuit board of claim 7, wherein the uppermost second wiring layer includes a single conductive layer without a seed layer.

10. The printed circuit board of claim 7, wherein an upper surface of the uppermost second wiring layer and an upper surface of the uppermost second insulating layer have a step therebetween.

11. The printed circuit board of claim 10, wherein the step provides a recessed region having at least a portion filled with the third insulating layer above the uppermost second insulating layer.

12. The printed circuit board of claim 7, wherein an uppermost first insulating layer of the plurality of first insulating layers is in contact with a lowermost second insulating layer of the one or more second insulating layers.

13. The printed circuit board of claim 12, wherein each wiring layer is spaced apart from a boundary between the uppermost first insulating layer and the lowermost second insulating layer.

14. The printed circuit board of claim 7, further comprising:
- a first passivation layer disposed below the first wiring structure and covering at least a portion of a lowermost first wiring layer of the plurality of first wiring layers; and
- a second passivation layer disposed above the third wiring structure and covering at least a portion of the third wiring layer.

15. The printed circuit board of claim 14, further comprising:
- a plurality of electronic components disposed on the second passivation layer,
- wherein each of the plurality of electronic components is connected to at least a portion of the third wiring layer and the plurality of electronic components are connected to each other through the one or more second wiring layers.

16. The printed circuit board of claim 15, wherein the plurality of electronic components include a logic chip and a memory chip.

17. A printed circuit board, comprising:
- a core layer;
- a plurality of upper insulating layers disposed on an upper side of the core layer;
- a plurality of upper wiring layers disposed on or in the plurality of upper insulating layers, respectively;
- a plurality of lower insulating layers disposed on a lower side of the core layer opposing the upper side; and
- a plurality of lower wiring layers disposed on or in the plurality of lower insulating layers, respectively,
- wherein a portion of one of the plurality of upper wiring layers has a fine pitch, relatively finer than those of other upper wiring layers among the plurality of upper wiring layers and relatively finer than those of the plurality of lower wiring layers, and
- wherein the one of the plurality of upper wiring layers having the portion with the fine pitch, and another of the plurality of upper wiring layers respectively protrude from opposing sides of one of the plurality of upper insulating layers.

18. The printed circuit board of claim 17, wherein the one of the plurality of upper wiring layers having the portion with the fine pitch is disposed between the core layer and the one of the plurality of upper insulating layers.

19. The printed circuit board of claim 17, wherein the number of the upper wiring layers is greater than the number of the lower wiring layers.

20. The printed circuit board of claim 17, further comprising:
- two or more vias extending from the another of the plurality of upper wiring layers to respectively connect to two among the plurality of upper wiring layers,
- wherein the two or more vias penetrates through different numbers of insulating layers among the plurality of upper insulating layers.

* * * * *